(12) United States Patent
Ikeda et al.

(10) Patent No.: US 7,368,034 B2
(45) Date of Patent: May 6, 2008

(54) METHOD OF MANUFACTURING SURFACE ACOUSTIC WAVE DEVICE

(75) Inventors: Shiro Ikeda, Fukushima-ken (JP); Satoshi Waga, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 361 days.

(21) Appl. No.: 11/179,111

(22) Filed: Jul. 11, 2005

(65) Prior Publication Data
US 2006/0005923 A1    Jan. 12, 2006

(30) Foreign Application Priority Data
Jul. 12, 2004   (JP)  ............. 2004-204642

(51) Int. Cl.
*B29C 65/00*   (2006.01)
*H03H 9/25*   (2006.01)
(52) U.S. Cl. ................. 156/293; 310/313 R
(58) Field of Classification Search ........... 156/293
See application file for complete search history.

(56) References Cited
FOREIGN PATENT DOCUMENTS

| | | |
|---|---|---|
| JP | 9-116364 | 5/1997 |
| JP | 09116364 | 5/1997 |
| JP | 09214271 | 8/1997 |

OTHER PUBLICATIONS

Copy of Search Report dated Jun. 7, 2006 for corresponding European Application No. 05014191.0.

*Primary Examiner*—Richard Crispino
*Assistant Examiner*—Emily Chimiak
(74) *Attorney, Agent, or Firm*—Brinks Hofer Gilson & Lione

(57) ABSTRACT

A method of manufacturing a surface acoustic wave device includes interposing a thermosetting adhesive between the insulator that is inserted in the housing portion while the comb-shaped electrodes are directed upward and a bottom portion of the housing portion, and curing the adhesive by heating in a state in which a conductive member is disposed near the opening portion to come in contact with the comb-shaped electrodes, such that the conductive member is separated from the comb-shaped electrodes. Accordingly, a process of forming a conductive film made of carbon and a process of removing the conductive film are not required. Therefore, it is possible to provide a method of manufacturing a surface acoustic wave device that has high productivity and that prevents pyroelectric breakdown between the comb-shaped electrodes at low cost.

3 Claims, 2 Drawing Sheets

METHOD OF MANUFACTURING SURFACE ACOUSTIC WAVE DEVICE

This application claims the benefit of priority to Japanese Patent Application No. 2004-204642 filed on Jul. 12, 2004, herein incorporated by reference.

BACKGROUND OF THE INVENTION

1. Field of the Invention

The present invention relates to a method of manufacturing a surface acoustic wave device suitable for wireless apparatuses, such as cellular phones.

2. Description of the Related Art

A method of manufacturing a surface acoustic wave device according to the related art will be described with reference to the drawings. FIG. 5 is a cross-sectional view of a surface acoustic wave device that is manufactured by a method of manufacturing a surface acoustic wave device according to the related art. FIG. 6 is a diagram illustrating a first process of the method of manufacturing a surface acoustic wave device according to the related art. FIG. 7 is a diagram showing a second process of the method of manufacturing a surface acoustic wave device according to the related art.

Next, the configuration of the surface acoustic wave device according to the related art will be described with reference to FIGS. 5 to 7. A base substrate member 51 made of ceramic has a housing portion 51b composed of a concave portion having an opening portion 51a at the top thereof. A plurality of terminals 52 are disposed on the base substrate member 51. In this case, the plurality of terminals 52 extend from the housing portion 51b to the outer surface the base substrate member 51.

Further, a surface acoustic wave element 53 is constituted by an insulator 54 made of ceramic and a plurality of comb-shaped electrodes 55 that are provided on one surface (top surface) 54a of the insulator 54. The surface acoustic wave element 53 is housed in the housing portion 51b, and the other surface (bottom surface) 54b of the insulator 54 is attached to the base substrate member 51 via a thermosetting adhesive 56 that is provided on a bottom portion 51c of the housing portion 51b.

Furthermore, the terminals 52 and the comb-shaped electrodes 55 are connected to each other in the housing portion 51b by bonding wires 57, and a lid 58 is attached to an upper end of the base substrate member 51 to close the opening portion 51a. In such a manner, the surface acoustic wave device according to the related art is formed.

Next, the method of manufacturing a surface acoustic wave device according to the related art will be described with reference to FIGS. 5 to 7. First, in the first process, as shown in FIG. 6, a conductive film 59 made of carbon is formed on the one surface 54a of the insulator 51, and the plurality of comb-shaped electrodes 55 are conducted by the conductive film 59. The other surface 54b of the surface acoustic wave element 53 is disposed on the thermosetting adhesive 56 that is provided on the bottom portion 51c.

Next, in this state, heating is performed to cure the thermosetting adhesive 56, such that the insulator 54 is adhered to the bottom portion 51c by the adhesive 56. Subsequently, in the second process shown in FIG. 7, the conductive film 59 is removed by oxygen plasma.

Next, as shown in FIG. 5, the terminals 52 and the comb-shaped electrodes 55 are connected to each other by bonding the wires 57 and then the lid 58 closes the housing portion 51b. In such a manner, the surface acoustic wave device according to the related art is manufactured.

According to the method of manufacturing a surface acoustic wave device according to the related art, in the state in which the plurality of comb-shaped electrodes 55 are conducted by the conductive film 59, the thermosetting adhesive 56 is heated, such that the insulator 54 is adhered to the bottom portion 59. Accordingly, pyroelectric breakdown between the comb-shaped electrodes 55 does not occur. However, the method of manufacturing a surface acoustic wave device according to the related art requires the process of providing the conductive film 59 for conducting the plurality of comb-shaped electrodes 55 and the process of removing the conductive film 59 by oxygen plasma. Therefore, the productivity is degraded and the manufacturing cost is increased.

According to the method of manufacturing a surface acoustic wave device according to the related art, in the state in which the plurality of comb-shaped electrodes 55 are conducted by the conductive film 59, the thermosetting adhesive 56 is heated, such that the insulator 54 is adhered to the bottom portion 59. Accordingly, the pyroelectric breakdown between the comb-shaped electrodes 55 does not occur. However, the method of manufacturing a surface acoustic wave device according to the related art requires the process of providing the conductive film 59 for conducting the plurality of comb-shaped electrodes 55 and the process of removing the conductive film 59 by oxygen plasma. Therefore, the productivity is degraded and the manufacturing cost is increased.

SUMMARY OF THE INVENTION

It is an object of the invention to provide a method of manufacturing a surface acoustic wave device that has high productivity and prevents pyroelectric breakdown between comb-shaped electrodes at low cost.

According to a first aspect of the invention, there is provided a method of manufacturing a surface acoustic wave device having a base substrate member, made of an insulating material, that has a housing portion composed of a concave portion having an opening portion at the top thereof, and a surface acoustic wave element that has a flat insulator and comb-shaped electrodes provided on one surface of the insulator. The method of manufacturing a surface acoustic wave device includes interposing a thermosetting adhesive between the insulator that is inserted in the housing portion while the comb-shaped electrodes are directed upward and a bottom portion of the housing portion, and curing the adhesive by heating in a state in which a conductive member is disposed near the opening portion to come in contact with the comb-shaped electrodes, such that the conductive member is separated from the comb-shaped electrodes.

According to a second aspect of the invention, the insulator is inserted in the housing portion in a state in which the adhesive is provided on the bottom portion or in a state in which the adhesive is provided on the other surface of the insulator, and the conductive member is separated from the comb-shaped electrodes after the adhesive is cooled.

According to a third aspect of the invention, the conductive member is made of an elastic material.

According to a fourth aspect of the invention, the conductive member is made of conductive rubber.

According to a fifth aspect of the invention, the insulator is pressed on the bottom portion by the conductive member.

According to a sixth aspect of the invention, on a top surface of the conductive member opposite to the comb-shaped electrodes, a flat-plate support member made of a metal is disposed to support the conductive member.

According to a seventh aspect of the invention, the support member is made of a metal plate, and the support member is attached to the conductive member in such a manner that a front end of a protrusion provided on the support member is attached to the conductive member or that a protruding portion provided on the conductive member is fitted into a hole of the support member.

According to an eighth aspect of the invention, the support member and the conductive member are electrically grounded.

DESCRIPTION OF THE PREFERRED EMBODIMENT

Figure 1:
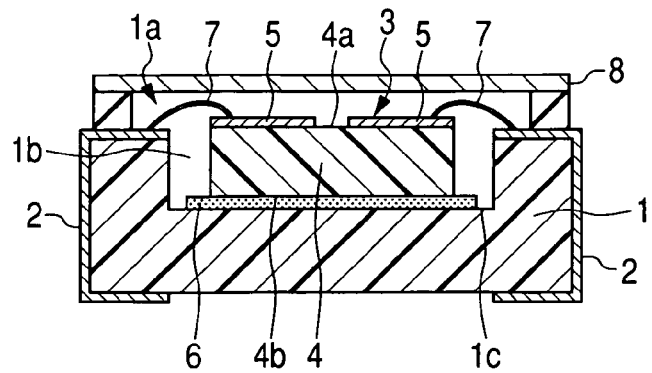
FIG. 1 is a cross-sectional view of a surface acoustic wave device that is manufactured by a method of manufacturing a surface acoustic wave device according to the invention.
Figure 2:
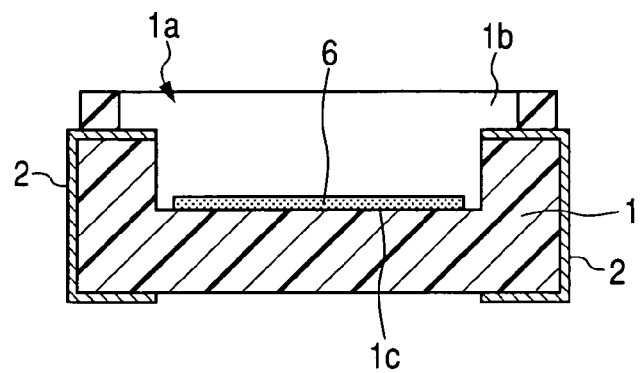
FIG. 2 is a diagram illustrating a first process of the method of manufacturing a surface acoustic wave device according to the invention.
Figure 3:
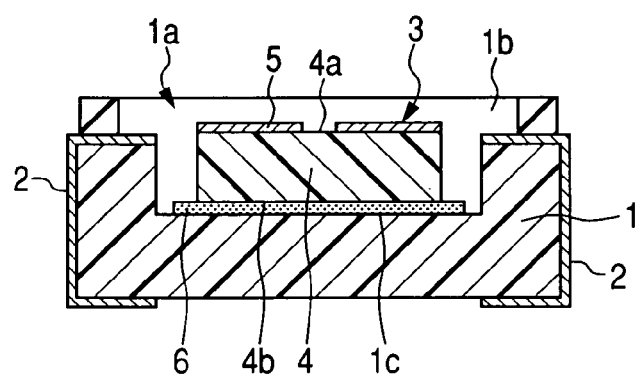
FIG. 3 is a diagram illustrating a second process of the method of manufacturing a surface acoustic wave device according to the invention.
Figure 4:
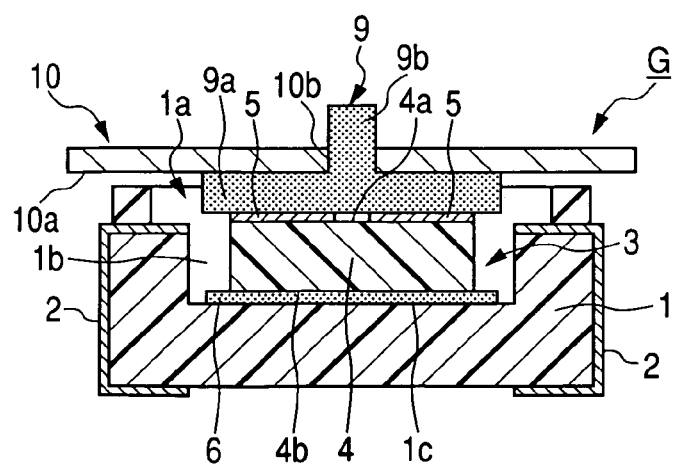
FIG. 4 is a diagram illustrating a third process of the method of manufacturing a surface acoustic wave device according to the invention.
Figure 5:
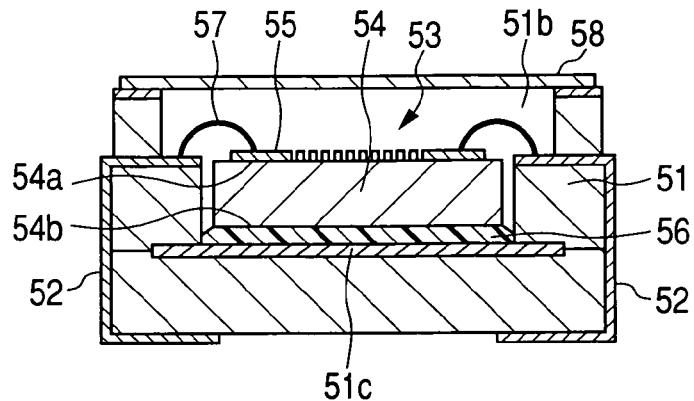
FIG. 5 is a cross-sectional view of a surface acoustic wave device that is manufactured by a method of manufacturing a surface acoustic wave device according to the related art.
Figure 6:
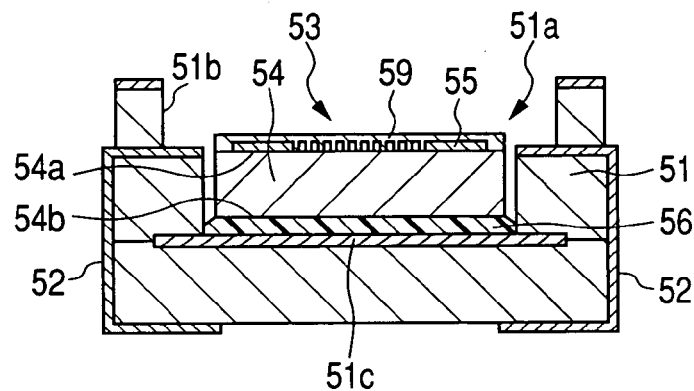
FIG. 6 is a diagram illustrating a first process of the method of manufacturing a surface acoustic wave device according to the related art.
Figure 7:
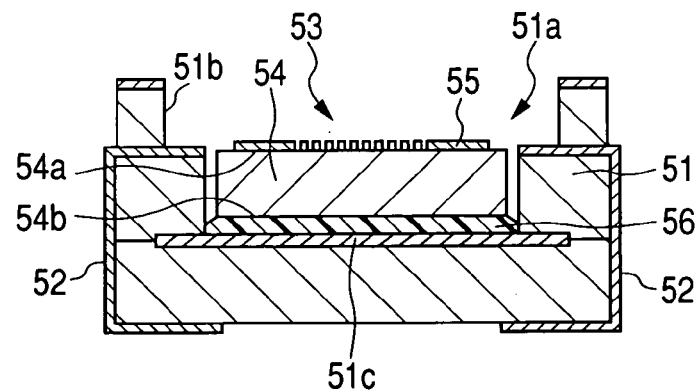
FIG. 7 is a diagram illustrating a second process of the method of manufacturing a surface acoustic wave device according to the related art.

A method of manufacturing a surface acoustic wave device according to the invention will now be described with reference to the drawings. FIG. 1 is a cross-sectional view of a surface acoustic wave device that is manufactured by the method of manufacturing a surface acoustic wave device according to the invention. FIG. 2 is a diagram illustrating a first process of the method of manufacturing a surface acoustic wave device according to the invention. FIG. 3 is a diagram illustrating a second process of the method of manufacturing a surface acoustic wave device according to the invention. FIG. 4 is a diagram illustrating a third process of the method of manufacturing a surface acoustic wave device according to the invention.

Next, the configuration of the surface acoustic wave device according to the invention will be described with reference to FIGS. 1 to 4. A base substrate member 1 is made of an insulating material and is a multi-layer substrate which is a laminate of a plurality of substrates. The base substrate member 1 has a housing portion 1b composed of a concave portion having an opening portion 1a at the top thereof. Further, a plurality of terminals 2 are provided on the base substrate member 1. In this case, the plurality of terminals 2 extend from the housing portion 1b to an outer surface of the base substrate member 1.

A surface acoustic wave element 3 is composed of a flat insulator 4 made of ceramic or the like and a plurality of comb-shaped electrodes 5 that are provided on one surface (top surface) 4a of the insulator 4. The surface acoustic wave element 3 is housed in the housing portion 1b and the other surface (bottom surface) 4b of the insulator 4 is attached to the base substrate member 1 by a thermosetting adhesive 6 that is provided on a bottom portion 1c of the housing portion 1b.

The terminals 2 and the comb-shaped electrodes 5 are connected to each other in the housing portion 1b by bonding wires 7 and a lid 8 is attached to a top end of the base substrate member 1 to close the opening portion 1a in a state in which an inert gas is sealed in the housing portion 1b. In such a manner, the surface acoustic wave device according to the invention is formed.

Next, the method of manufacturing a surface acoustic wave device according to the invention will be described with reference to FIGS. 1 to 4. First, in the first process shown in FIG. 2, the thermosetting adhesive 6 is provided on the bottom portion 1c of the housing portion 1b. Subsequently, in the second process shown in FIG. 3, the surface acoustic wave element 3 is inserted in the housing portion 1b and then the other surface 4b of the insulator 4 is disposed on the thermosetting adhesive 6 in a state in which the plurality of comb-shaped electrodes 5 are directed upward.

Though the adhesive 6 is provided on the bottom portion 1c in this embodiment, in a state in which the adhesive 6 is provided on the other surface (bottom surface) 4b of the insulator 4, the surface acoustic wave element 3 may be inserted in the housing portion 1b, such that the adhesive 6 is disposed on the bottom portion 1c.

Then, in the third process shown in FIG. 4, a jig G to be disposed on the surface acoustic wave element 3 is prepared. The jig G has a conductive member 9 made of elastic and conductive rubber and a support member 10, made of a metal plate, that is positioned above the conductive member 9 to be combined with the conductive member 9. Further, the conductive member 9 and the support member 10 are electrically grounded.

Furthermore, the conductive member 9 has a flat portion 9a and a protruding portion 9b that protrudes upward from the flat portion 9a. The support member 10 has a flat plate portion 10a and a hole 10b that is provided in the flat plate portion 10a. The conductive member 9 is positioned with respect to the support member 10 by disposing the flat portion 9a of the conductive member 9 below the flat plate portion 10a and then by fitting the protruding portion 9b into the hole 10b and then the conductive member 9 is attached to the support member 10.

In addition, though not shown in FIG. 4, the flat portion 9a of the conductive member 9 may be adhered to a front end of a protrusion protruding from the support member 10 by an adhesive or the like, such that the conductive member 9 can be attached to the support member 10.

According to the jig G having such a configuration, in a state in which the flat portion 9a of the conductive member 9 comes in contact with the plurality of comb-shaped electrodes 5, the insulator 4 is pressed by the conductive member 9 through pressing of the support member 10. In this state, the jig G, the surface acoustic wave element 3, and the base substrate member 1 are transferred into a heating furnace or the like, and the thermosetting adhesive 6 is heated and cured, such that the insulator 4 and the base substrate member 1 adhered and fixed to each other by the adhesive 6.

Then, the jig G, the surface acoustic wave element 3, and the base substrate member 1 are transferred outside the heating furnace. Next, after the jig G, the surface acoustic wave element 3, and the base substrate member, including the adhesive 6, are cooled to an atmospheric temperature or less, the jig G is moved upward and then the conductive member 9 is separated from the comb-shaped electrodes 5. Subsequently, as shown in FIG. 1, the terminals 2 and the comb-shaped electrodes 5 are connected to each other by bonding the wires 7 and then the housing portion 1b is closed by the lid 8. In such a manner, the surface acoustic wave device according to the invention is manufactured.

There is provided the method of manufacturing a surface acoustic wave device according to the invention having a base substrate member, made of an insulating material, that has a recess composed of the concave portion having an opening portion at the top thereof, and a surface acoustic wave element that has a flat insulator and comb-shaped electrodes provided on one surface of the insulator. The method of manufacturing a surface acoustic wave device according to the invention includes The method of manufacturing a surface acoustic wave device includes interposing a thermosetting adhesive between the insulator that is inserted in the housing portion while the comb-shaped electrodes are directed upward and a bottom portion of the housing portion, and curing the adhesive by heating in a state in which a conductive member is disposed near the opening portion to come in contact with the comb-shaped electrodes, such that the conductive member is separated from the comb-shaped electrodes. Accordingly, a process of forming a conductive film made of carbon and a process of removing the conductive film are not required, unlike the method of manufacturing a surface acoustic wave device according to the related art. Therefore, it is possible to provide a method of manufacturing a surface acoustic wave device that has high productivity and prevents the pyroelectric breakdown between the comb-shaped electrodes at low cost.

The insulator is inserted in the housing portion in a state in which the adhesive is provided on the bottom portion or in a state in which the adhesive is provided on the other surface of the insulator, and the conductive member is separated from the comb-shaped electrodes after the adhesive is cooled. Accordingly, it is possible to provide a method of manufacturing a surface acoustic wave device that can suppress a voltage between the comb-shaped electrodes caused by a change in temperature, thereby preventing the pyroelectric breakdown between the comb-shaped electrodes.

The conductive member is made of an elastic material, and thus the conductive member can come in good contact with the comb-shaped electrodes.

The conductive member is made of conductive rubber, and thus the conductive member can come in better contact with the comb-shaped electrodes.

The insulator is pressed on the bottom portion by the conductive member, and thus the conductive member can come in good contact with the comb-shaped electrodes. Further, the adhesive is cured in a state in which the insulator is pressed, and thus the insulator can reliably come in contact with the bottom portion.

Further, on a top surface of the conductive member opposite to the comb-shaped electrodes, a flat-plate support member made of a metal is disposed to support the conductive member. Accordingly, the conductive member is reliably held and stably moved.

Further, the support member is made of a metal plate, and the support member is attached to the conductive member in such a manner that a front end of a protrusion provided on the support member is attached to the conductive member or that a protruding portion provided on the conductive member is fitted into a hole of the support member. Accordingly, the conductive member is reliably attached to the support member and is reliably positioned with respect to the support member.

Further, the support member and the conductive member are electrically grounded. Accordingly, the pyroelectric breakdown between the comb-shaped electrodes can be reliably prevented.

The invention claimed is:

1. A method of manufacturing a surface acoustic wave device having a base substrate member, made of an insulating material, that has a housing portion composed of a concave portion having an opening portion at a top thereof and a surface acoustic wave element that has a flat insulator and comb-shaped electrodes provided on one surface of the insulator, the method of manufacturing a surface acoustic wave device comprising:

interposing a thermosetting adhesive between the insulator that is inserted in the housing portion while the comb-shaped electrodes are directed upward and a bottom portion of the housing portion;

curing the adhesive by heating in a state in which a conductive member is disposed near the opening portion to come in contact with the comb-shaped electrodes;

cooling the adhesive and separating the conductive member from the comb-shaped electrodes; and wherein, on a top surface of the conductive member opposite to the comb-shaped electrodes, a flat-plate support member made of a metal is disposed to support the conductive member.

2. The method of manufacturing a surface acoustic wave device according to claim 1,
   wherein the support member is made of a metal plate, and the support member is attached to the conductive member in such a manner that a front end of a protrusion provided on the support member is attached to the conductive member or that a protruding portion provided on the conductive member is fitted into a hole of the support member.

3. The method of manufacturing a surface acoustic wave device according to claim 1,
   wherein the support member and the conductive member are electrically grounded.

* * * * *